United States Patent
Jung et al.

(10) Patent No.: US 7,419,760 B2
(45) Date of Patent: *Sep. 2, 2008

(54) TOP ANTI-REFLECTIVE COATING COMPOSITION, METHOD FOR FORMING THE PATTERN OF A SEMICONDUCTOR DEVICE USING THE SAME, AND SEMICONDUCTOR DEVICE COMPRISING THE PATTERN

(75) Inventors: Jae Chang Jung, Seoul (KR); Cheol Kyu Bok, Gyunggi-do (KR); Sam Young Kim, Gyunggi-do (KR); Chang Moon Lim, Gyunggi-do (KR); Seung Chan Moon, Yongin-Si (KR)

(73) Assignee: Hynix Semiconductor Inc., Icheon-Shi (KR)

( * ) Notice: Subject to any disclaimer, the term of this patent is extended or adjusted under 35 U.S.C. 154(b) by 437 days.

This patent is subject to a terminal disclaimer.

(21) Appl. No.: 11/158,627

(22) Filed: Jun. 22, 2005

(65) Prior Publication Data

US 2006/0063104 A1 Mar. 23, 2006

(30) Foreign Application Priority Data

Sep. 17, 2004 (KR) .................... 10-2004-0074762

(51) Int. Cl.
- G03C 1/76 (2006.01)
- G03F 7/30 (2006.01)
- G03F 7/00 (2006.01)

(52) U.S. Cl. ............... 430/270.1; 430/273.1; 430/329; 430/330; 430/906; 430/909; 430/910; 430/921; 430/925

(58) Field of Classification Search ............. 430/270.1, 430/330, 273.1, 329, 906, 909, 910, 921, 430/925

See application file for complete search history.

(56) References Cited

U.S. PATENT DOCUMENTS

| | | | |
|---|---|---|---|
| 5,879,853 A | 3/1999 | Azuma | |
| 6,057,080 A | 5/2000 | Brunsvold et al. | |
| 6,274,295 B1 | 8/2001 | Dammel et al. | |
| 6,723,485 B1 * | 4/2004 | Tsutumi et al. | 430/270.1 |
| 2001/0023050 A1 * | 9/2001 | Numata et al. | 430/270.1 |
| 2003/0108819 A1 * | 6/2003 | Watanabe et al. | 430/311 |
| 2003/0219682 A1 | 11/2003 | Wakiya et al. | |

FOREIGN PATENT DOCUMENTS

| | | |
|---|---|---|
| JP | 09-015850 | 1/1997 |
| JP | 11-035573 | 2/1999 |
| JP | 2000-171967 | 6/2000 |
| JP | 2003-020313 | 1/2003 |

* cited by examiner

Primary Examiner—Thorl Chea
(74) Attorney, Agent, or Firm—Marshall, Gerstein & Borun LLP (57) ABSTRACT

Disclosed herein is a top anti-reflective coating composition comprising a bisulfone compound, as a photoacid generator, represented by Formula 1 below:

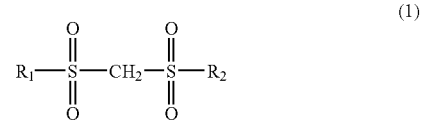

wherein $R^1$ and $R_2$ are independently, a straight, branched or cyclic alkyl, aryl, alkenyl, oxoalkyl or oxoaryl group of 1 to 20 carbon atoms; or a halogen-substituted straight, branched or cyclic alkyl, aryl, alkenyl, oxoalkyl or oxoaryl group of 1 to 20 carbon atoms.

Since the top anti-reflective coating composition dissolves a portion of a photoacid generator present at the top of an underlying photosensitizer, particularly, upon formation of a top anti-reflective coating, it can prevent the top from being formed into a thick section. Therefore, the use of the anti-reflective coating composition enables the formation of a vertical pattern of a semiconductor device.

14 Claims, 4 Drawing Sheets

TOP ANTI-REFLECTIVE COATING COMPOSITION, METHOD FOR FORMING THE PATTERN OF A SEMICONDUCTOR DEVICE USING THE SAME, AND SEMICONDUCTOR DEVICE COMPRISING THE PATTERN

BACKGROUND OF THE INVENTION

1. Field of the Invention

The present invention relates to an anti-reflective coating composition used in a photolithography process, which is one fabrication process for a semiconductor device, and a method for forming the pattern of a semiconductor device using the anti-reflective coating composition. More specifically, the present invention relates to a top anti-reflective coating composition usable in immersion lithography for the fabrication of a sub-50 nm semiconductor device, and a method for forming a pattern of a semiconductor device using the top anti-reflective coating composition.

2. Description of the Related Art

Photolithography is a process for the transfer of a semiconductor circuit pattern formed on a photomask to a wafer, and is one of the most important processes in determining the fineness and integration density of circuits in the fabrication of semiconductor devices.

In recent years, as the integration density of semiconductor devices has increased, new techniques have been developed that have been adapted to fine processing required in the fabrication of semiconductor devices. Under these circumstances, there is an increasing need for a fine processing technique in a photolithography process. That is, as the circuit line widths become finer and finer, the use of short-wavelength light sources for illumination, such as KrF, ArF, F2 and EUV excimer lasers, and high numerical aperture lenses is required. EUV, F2, ArF and KrF lasers in that order are preferred as light sources because of their short wavelengths.

Particularly, a number of studies on the development of sub-50 nm devices have been actively undertaken. In response to these studies, recent attention has been directed toward the development of suitable processing equipment and materials associated with the use of F2 and EUV as exposure light sources. Technical solutions for the use of F2 are satisfactory to some extent, but there are the following problems: 1) high-quality $CaF_2$ is difficult to produce on an industrial scale within a short time, 2) since soft pellicles are likely to be deformed upon exposure to light at 157 nm, their life is short, and 3) hard pellicles incur considerable production costs, and are difficult to produce on a commercial scale due to the nature of light refraction.

On the other hand, since suitable light sources, exposure equipment, and masks are required to use EUV lasers, they are not yet suitable for practical use. Accordingly, the formation of finer high-precision photoresist patterns using a photoresist, and adapted for the use of an ArF excimer laser has now become a key technical task. Under these circumstances, immersion lithography has recently drawn attention.

Dry lithography is a current lithography process, and is an exposure system wherein air is filled between an exposure lens and a wafer. In contrast to dry lithography, immersion lithography, which corresponds to an NA scaling technique, is an exposure system wherein water is filled between an exposure lens and a wafer. Since water (with a refractive index (n)=1.4) is used as a medium for a light source in the immersion lithography, the NA is 1.4 times larger than that in the dry lithography using air (refractive index (n)=1.0). Accordingly, immersion lithography is advantageous in terms of its high resolution.

A problem encountered with the fabrication of a sub-50 nm semiconductor device is that alteration in the critical dimension (CD) of a photoresist pattern inevitably takes place, during a process for the formation of an ultra fine pattern, by standing waves, reflective notching, and diffracted and reflected light from an underlying layer due to the optical properties of the underlying layer on an overlying photoresist and due to variation in the thickness of the photoresist. To prevent the reflected light from reaching the underlying layer, a light-absorbing material, called an "anti-reflective coating", at a wavelength band of light used as an exposure light source is introduced between the underlying layer and the photoresist. A bottom anti-reflective coating interposed between the underlying layer and the photoresist has been used to date. With the recent increase in the fineness of photoresist patterns, a top anti-reflective coating (TARC) has also been introduced in order to prevent the photoresist pattern from being disrupted by the reflected and diffracted light. Specifically, as the miniaturization of semiconductor devices makes photoresist patterns extremely fine, the use of a bottom anti-reflective coating alone cannot completely prevent the patterns from being disrupted by scattered reflection. Accordingly, a top anti-reflective coating is introduced to prevent the disruption of the patterns.

However, since conventional top anti-reflective coatings for use in dry lithography are water-soluble (in the case of using KrF or ArF laser), they cannot be applied to immersion lithography. In other words, since water is used as a medium for the light source in immersion lithography, it easily dissolves the conventional top anti-reflective coatings.

Accordingly, an ideal top anti-reflective coating for use in immersion lithography must satisfy the following requirements: 1) the top anti-reflective coating must be transparent to a light source; 2) the top anti-reflective coating must have a refractive index between 1.5 and 1.65, depending on the kind of underlying photosensitive film (i.e. photoresist) to be used; 3) when the top anti-reflective coating composition is coated on an underlying photosensitive film, it must not dissolve the photosensitive film; 4) the top anti-reflective coating must not be soluble in water upon light exposure; 5) the top anti-reflective coating must be soluble in a developing solution; and 6) the top anti-reflective coating must enable the formation of a vertical pattern.

The above-mentioned stringent requirements make the development of a suitable top anti-reflective coating for use in immersion lithography difficult. Particularly, a new concept top anti-reflective coating composition is needed to satisfy the requirement of 6).

Thus, there exists a strong need for the development of a top anti-reflective coating for use in immersion lithography which is water-insoluble and enables the formation of a vertical pattern upon formation of a semiconductor pattern.

SUMMARY OF THE INVENTION

The present invention has been made in view of the above problems, and it is an object of the present invention to provide a top anti-reflective coating composition which can be used in immersion lithography due to its water insolubility, can prevent multiple interference of light inside a photoresist in the formation of a photoresist pattern, can inhibit the alteration in the dimensions of the photoresist pattern resulting from the variation in the thickness of the photoresist, and enables the formation of a vertical semiconductor pattern.

It is another object of the present invention to provide a method for forming a pattern of a semiconductor device using the top anti-reflective coating composition. In accordance with one aspect of the present invention for achieving the above objects, there is provided a top anti-reflective coating composition comprising bissulfone compounds, as a photoacid generator, represented by Formula 1 below:

Formula 1 wherein $R^1$ and $R_2$ are independently a straight, branched or cyclic alkyl, aryl, alkenyl, oxoalkyl or oxoaryl group of 1 to 20 carbon atoms; or a halogen-substituted straight, branched or cyclic alkyl, aryl, alkenyl, oxoalkyl or oxoaryl group of 1 to 20 carbon atoms.

In accordance with another aspect of the present invention, there is provided a method for forming the pattern of a semiconductor device comprising the steps of: (a) applying a photoresist to a semiconductor substrate on which a particular underlying structure is formed; (b) applying the top anti-reflective coating composition on top of the photoresist to form a top anti-reflective coating; and (c) exposing the photoresist to light, followed by developing, to form a photoresist pattern.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The present invention provides a top anti-reflective coating composition comprising a top anti-reflective coating polymer, a photoacid generator, and an organic solvent.

The top anti-reflective coating composition of the present invention is characterized in that the bissulfone compound of Formula 1 below is used as a photoacid generator.

Formula 1 wherein $R^1$ and $R_2$ are independently a straight, branched or cyclic alkyl, aryl, alkenyl, oxoalkyl or oxoaryl group of 1 to 20 carbon atoms; or a halogen-substituted straight, branched or cyclic alkyl, aryl, alkenyl, oxoalkyl or oxoaryl group of 1 to 20 carbon atoms.

Since the bissulfone compound of Formula 1 is hardly water-soluble and at the same time acts as a photoacid generator, it can be used to prepare a top anti-reflective coating composition for immersion lithography. In addition, the top anti-reflective coating composition dissolves a portion of a photoacid generator present at the top of an underlying photosensitizer upon pattern formation, thus preventing the top from being formed into a thick section.

Examples of the bissulfone compound used as a photoacid generator in the composition of the present invention include, for example:

bistrifluoromethyl sulfonyl methane represented by Formula 2 below:

Formula 2 bisethyl sulfonyl methane represented by Formula 3 below:

Formula 3 bis-p-toluene sulfonyl methane represented by Formula 4 below:

Formula 4

The top anti-reflective coating composition of the present invention comprises 0.05~5 wt % of the bissulfone compound, based on the weight of the top anti-reflective coating polymer. When the content of the bissulfone compound in the top anti-reflective coating composition is less than 0.05 wt %, the above-mentioned effects of the photoacid generator cannot be attained. Meanwhile, when the content of the bissulfone compound exceeds 5 wt %, the section of the underlying photosensitizer is inclined.

In addition, a top anti-reflective coating to be formed absorbs light at 193 nm, significantly impairing the functions of the anti-reflective coating, and the amount of light entering the photosensitizer is decreased and thus, a higher exposure energy is required, resulting in lower productivity.

Accordingly, the content of the bissulfone compound in the top anti-reflective coating composition is preferably limited to 0.05~5 wt %, based on the weight of the top anti-reflective coating polymer.

Examples of the top anti-reflective coating polymer contained in the top anti-reflective coating composition of the present invention include polymers having high light transmission such that they can be used in the formation of top anti-reflective coatings.

The top anti-reflective coating polymer is not specially restricted, so long as it is highly soluble in a developing solution after light exposure, thus having no effect on the formation of a pattern, and is water insoluble, thus enabling its application to immersion lithography. Examples of preferred top anti-reflective coating polymers include, for example:

poly(t-butylacrylate-acrylic acid-3-hydroxypropylmethacrylate) of Formula 5 below:

Formula 5 wherein a, b and c, representing the mole fraction of each monomer, are in the range between 0.05 and 0.9;

poly(t-butylacrylate-acrylic acid-N-isopropylacrylamide) of Formula 6 below:

Formula 6 wherein a, b and c are as defined in Formula 5; and poly(t-butylacrylate-acrylic acid-2-hydroxyethylmethacrylate) of Formula 7 below:

Formula 4 wherein a, b and c are as defined in Formula 5.

Organic solvents usable in the top anti-reflective coating composition of the present invention are not specially limited so long as they can dissolve the top anti-reflective coating polymer, the bissulfone compound, and the like. n-Butanol is particularly preferred.

Considering the thickness of the anti-reflective coating composition, n-butanol is preferably used in an amount of 1,000~10,000 wt %, based on the weight of the top anti-reflective coating polymer. If the amount of the n-butanol is outside this range, the thickness of the anti-reflective coating cannot be optimized.

The top anti-reflective coating composition of the present invention may further comprise an acid diffusion inhibitor. The acid diffusion inhibitor is not specially limited so long as it can inhibit diffusion of an acid. L-proline is particularly preferred. The top anti-reflective coating composition of the present invention may comprise 1~20 wt % of L-proline as the acid diffusion inhibitor, based on the weight of the top anti-reflective coating polymer. The acid diffusion inhibitor contained in the top anti-reflective coating composition acts to further inhibit the diffusion of an acid toward the unexposed region.

The top anti-reflective coating composition has an optimal reflective index of 1.5 to 1.65. Accordingly, when the top anti-reflective coating composition is over coated on top of a photoresist, the reflectance can be minimized and thus the photoresist pattern can be protected from being disrupted by reflected light.

The present invention also provides a method for forming a pattern of a semiconductor device comprising the steps of: (a) applying a photoresist to a semiconductor substrate on which a particular underlying structure is formed; (b) applying the top anti-reflective coating composition on top of the photoresist to form a top anti-reflective coating; and (c) exposing the photoresist to light, followed by developing, to form a photoresist pattern.

The pattern formation method according to the present invention is characterized in that the anti-reflective coating formed on top of the photoresist is formed using the top anti-reflective coating composition of the present invention. Since the top anti-reflective coating thus formed has a reflective index of 1.5 to 1.65, the reflectance at the top of the photoresist can be minimized. Accordingly, the photoresist pattern formed by the method of the present invention has greatly improved pattern uniformity.

According to the pattern formation method of the present invention, baking may be carried out before and/or after light exposure. The baking is preferably carried out at 70° C.~200° C.

The anti-reflective coating composition and the pattern formation method of the present invention are mainly applied to a process for forming an ultra fine pattern using an ArF light source (193 nm). Likewise, they can be applied to a process for forming an ultra fine pattern using a light source (e.g., F2 or EUV) having a shorter wavelength, so long as water can be used as a medium for the light source. The light exposure using the light source is preferably achieved with exposure energy of 0.1 to 50 mJ/cm$^2$.

In the pattern formation method of the present invention, the developing can be carried out using an alkaline developing solution. As a particularly preferred alkaline developing solution, a 0.01~5% (w/w) solution of tetramethylammoniumhydroxide (TMAH) in water is used.

The present invention also provides the use of the top anti-reflective coating composition in the fabrication of a semiconductor device. Since the top anti-reflective coating composition of the present invention can minimize scattered reflection, it can be applied to various processes for fabricating semiconductor devices, in addition to the formation process of an ultra fine pattern.

It can be appreciated that the top anti-reflective coating composition of the present invention can be applied to a variety of processes in ways obvious to those skilled in the art, depending on the type of the processes. Accordingly, the detailed explanations concerning the application of the anti-reflective coating composition to the fabrication of semiconductor devices are omitted. The present invention will now be described in more detail with reference to the following examples. However, these examples are given for the purpose of illustration and are not to be construed as limiting the scope of the invention.

COMPARATIVE EXAMPLE 1

Preparation of Top Anti-reflective Coating Composition and Pattern Formation 2.5 g of poly(t-butylacrylate-acrylic acid-3-hydroxypropylmethacrylate) was dissolved in 100 g of n-butanol to provide a top anti-reflective coating composition for immersion lithography.

Figure 1:
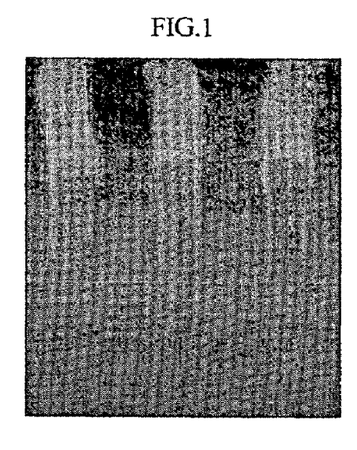
FIG. 1 is an 80 nm-L/S image of a semiconductor pattern formed using a top anti-reflective coating composition prepared in Comparative Example 1 of the present invention.

A photosensitizer (AR1221J, JSR) was coated to a thickness of 220 nm on a wafer, and baked at 130° C. for 90 seconds. The top anti-reflective coating composition was coated at 3,000 rpm on the coated photosensitizer, and baked at 90° C. for 60 seconds. After exposing the wafer to light using ArF exposure equipment, the exposed wafer was baked at 130° C. for 90 seconds and developed to form a pattern. An image of the pattern is shown in FIG. 1. This image shows that the pattern was formed in a slight 't-top' shape.

EXAMPLE 1

Preparation of Top Anti-reflective Coating Composition and Pattern Formation 2.5 g of poly(t-butylacrylate-acrylic acid-3-hydroxypropylmethacrylate) and 0.15 g of bistrifluoromethyl sulfonyl methane were dissolved in 100 g of n-butanol to provide a top anti-reflective coating composition for immersion lithography.

Figure 2:
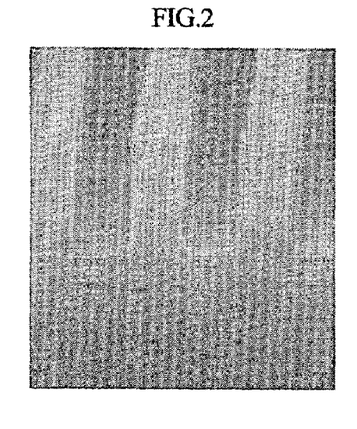
FIG. 2 is an 80 nm-L/S image of a semiconductor pattern formed using a top anti-reflective coating composition prepared in Example 1 of the present invention.

A photosensitizer (AR1221J, JSR) was coated to a thickness of 220 nm on a wafer, and baked at 130° C. for 90 seconds. The top anti-reflective coating composition was coated at 3,000 rpm on the coated photosensitizer, and baked at 90° C. for 60 seconds. After exposing the wafer to light using ArF exposure equipment, the exposed wafer was baked at 130° C. for 90 seconds and developed to form a pattern. An image of the pattern is shown in FIG. 2. This image indicates that the pattern was vertically formed when compared to the pattern formed in Comparative Example 1 (see FIG. 1).

EXAMPLE 2

Preparation of Top Anti-reflective Coating Composition and Pattern Formation

A top anti-reflective coating composition was prepared in the same manner as in Example 1, except that bisethyl sulfonyl methane was used as a photoacid generator. Further, a pattern was formed using the top anti-reflective coating composition in the same manner as in Example 1.

Figure 3:
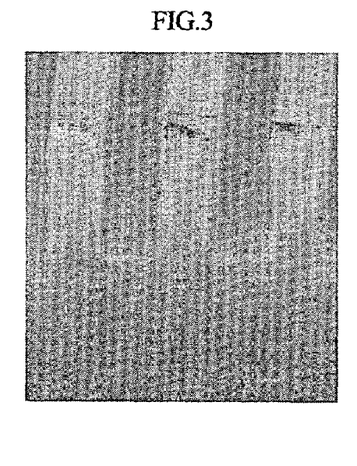
FIG. 3 is an 80 nm-L/S image of a semiconductor pattern formed using a top anti-reflective coating composition prepared in Example 2 of the present invention.

The image of the pattern thus formed is shown in FIG. 3. This image indicates that the pattern was vertically formed when compared to the pattern formed in Comparative Example 1 (see FIG. 1).

EXAMPLE 3

Preparation of Top Anti-reflective Coating Composition and Pattern Formation

A top anti-reflective coating composition was prepared in the same manner as in Example 1, except that bis-p-toluene sulfonyl methane was used as a photoacid generator. Further, a pattern was formed using the top anti-reflective coating composition in the same manner as in Example 1.

Figure 4:
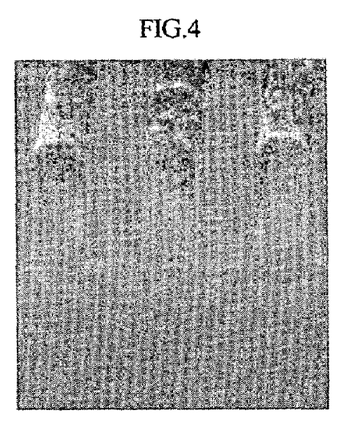
FIG. 4 is an 80 nm-L/S image of a semiconductor pattern formed using a top anti-reflective coating composition prepared in Example 3 of the present invention.

An image of the pattern formed is shown in FIG. 4. This image indicates that the pattern was vertically formed when compared to the pattern formed in Comparative Example 1 (see FIG. 1).

COMPARATIVE EXAMPLE 2

Preparation of Top Anti-reflective Coating Composition and Pattern Formation

A top anti-reflective coating composition was prepared in the same manner as in Comparative Example 1, except that poly(t-butylacrylate-acrylic acid-N-isopropylacrylamide) was used as a top anti-reflective coating polymer. Further, a pattern was formed using the top anti-reflective coating composition in the same manner as in Comparative Example 1.

Figure 5:
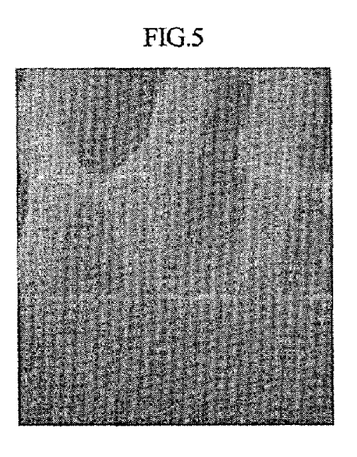
FIG. 5 is an 80 nm-L/S image of a semiconductor pattern formed using a top anti-reflective coating composition prepared in Comparative Example 2 of the present invention.

An image of the pattern thus formed is shown in FIG. 5. This image shows that the pattern was formed in a slight 't-top' shape.

EXAMPLE 4

Preparation of Top Anti-reflective Coating Composition and Pattern Formation

A top anti-reflective coating composition was prepared in the same manner as in Example 1, except that poly(t-butylacrylate-acrylic acid-N-isopropylacrylamide) was used as the top anti-reflective coating polymer. Further, a pattern was formed using the top anti-reflective coating composition in the same manner as in Example 1.

Figure 6:
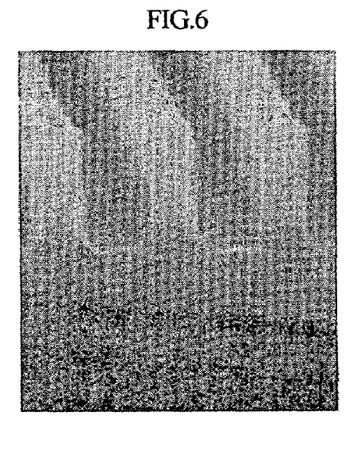
FIG. 6 is an 80 nm-L/S image of a semiconductor pattern formed using a top anti-reflective coating composition prepared in Example 4 of the present invention.

An image of the pattern thus formed is shown in FIG. 6. This image indicates that the pattern was vertically formed when compared to the pattern formed in Comparative Example 2 (see FIG. 5).

EXAMPLE 5

Preparation of Top Anti-reflective Coating Composition and Pattern Formation

A top anti-reflective coating composition was prepared in the same manner as in Example 2, except that poly(t-butylacrylate-acrylic acid-N-isopropylacrylamide) was used as a top anti-reflective coating polymer. Further, a pattern was formed using the top anti-reflective coating composition in the same manner as in Example 2.

Figure 7:
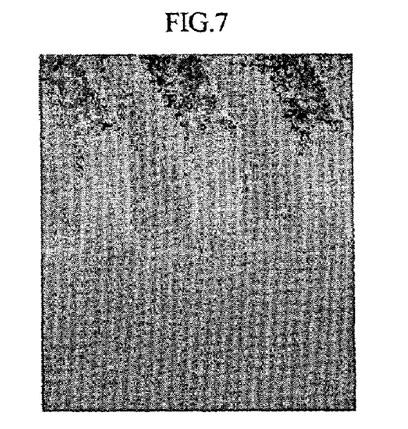
FIG. 7 is an 80 nm-L/S image of a semiconductor pattern formed using a top anti-reflective coating composition prepared in Example 5 of the present invention.

An image of the pattern thus formed is shown in FIG. 7. This image indicates that the pattern was vertically formed when compared to the pattern formed in Comparative Example 2 (see FIG. 5).

EXAMPLE 6

Preparation of Top Anti-reflective Coating Composition and Pattern Formation

A top anti-reflective coating composition was prepared in the same manner as in Example 3, except that poly(t-butylacrylate-acrylic acid-N-isopropylacrylamide) was used as a top anti-reflective coating polymer. Further, a pattern was formed using the top anti-reflective coating composition in the same manner as in Example 3.

Figure 8:
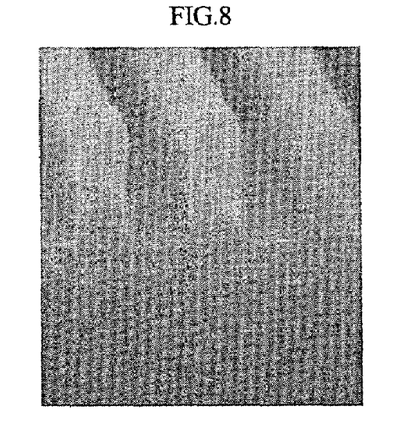
FIG. 8 is an 80 nm-L/S image of a semiconductor pattern formed using a top anti-reflective coating composition prepared in Example 6 of the present invention.

An image of the pattern thus formed is shown in FIG. 8. This image indicates that the pattern was vertically formed when compared to the pattern formed in Comparative Example 2 (see FIG. 5).

COMPARATIVE EXAMPLE 3

Preparation of Top Anti-reflective Coating Composition and Pattern Formation

A top anti-reflective coating composition was prepared in the same manner as in Comparative Example 1, except that poly(t-butylacrylate-acrylic acid-2-hydroxyethylmethacrylate) was used as a top anti-reflective coating polymer. Further, a pattern was formed using the top anti-reflective coating composition in the same manner as in Comparative Example 1.

Figure 9:
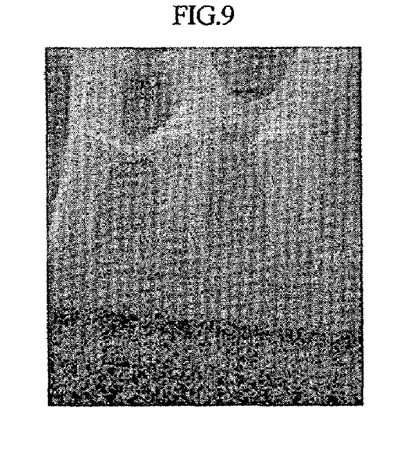
FIG. 9 is an 80 nm-L/S image of a semiconductor pattern formed using a top anti-reflective coating composition prepared in Comparative Example 3 of the present invention.

An image of the pattern thus formed is shown in FIG. 9. This image shows that the pattern was formed in a slight 't-top' shape.

EXAMPLE 7

Preparation of Top Anti-reflective Coating Composition and Pattern Formation

A top anti-reflective coating composition was prepared in the same manner as in Example 1, except that poly(t-butylacrylate-acrylic acid-2-hydroxyethylmethacrylate) was used as a top anti-reflective coating polymer. Further, a pattern was formed using the top anti-reflective coating composition in the same manner as in Example 1.

Figure 10:
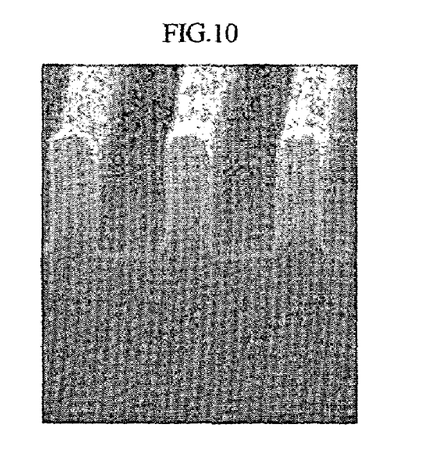
FIG. 10 is an 80 nm-L/S image of a semiconductor pattern formed using a top anti-reflective coating composition prepared in Example 7 of the present invention.

An image of the pattern thus formed is shown in FIG. 10. This image indicates that the pattern was vertically formed when compared to the pattern formed in Comparative Example 3 (see FIG. 9).

EXAMPLE 8

Preparation of the Top Anti-reflective Coating Composition and Pattern Formation A top anti-reflective coating composition was prepared in the same manner as in Example 2, except that poly(t-butylacrylate-acrylic acid-2-hydroxyethylmethacrylate) was used as a top anti-reflective coating polymer. Further, a pattern was formed using the top anti-reflective coating composition in the same manner as in Example 2.

Figure 11:
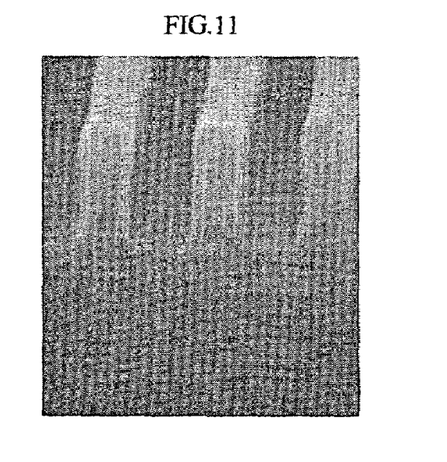
FIG. 11 is an 80 nm-L/S image of a semiconductor pattern formed using a top anti-reflective coating composition prepared in Example 8 of the present invention.

An image of the pattern thus formed is shown in FIG. 11. This image indicates that the pattern was vertically formed when compared to the pattern formed in Comparative Example 3 (see FIG. 9).

EXAMPLE 9

Preparation of the Top Anti-reflective Coating Composition and Pattern Formation A top anti-reflective coating composition was prepared in the same manner as in Example 3, except that poly(t-butylacrylate-acrylic acid-2-hydroxyethylmethacrylate) was used as a top anti-reflective coating polymer. Further, a pattern was formed using the top anti-reflective coating composition in the same manner as in Example 3.

Figure 12:
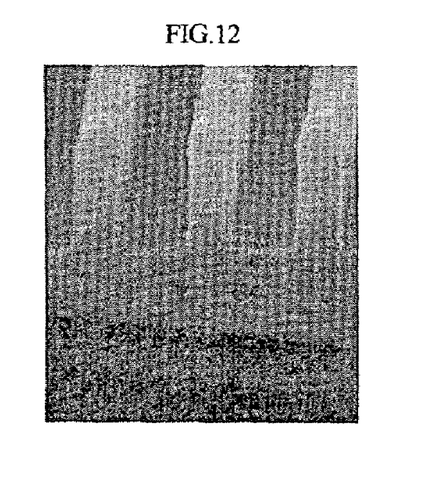
FIG. 12 is an 80 nm-L/S image of a semiconductor pattern formed using a top anti-reflective coating composition prepared in Example 9 of the present invention.

An image of the pattern thus formed is shown in FIG. 12. This image indicates that the pattern was vertically formed when compared to the pattern formed in Comparative Example 3 (see FIG. 9).

As apparent from the above description, the top anti-reflective coating formed using the anti-reflective coating composition of the present invention satisfies the following requirements for use in immersion lithography: 1) since the top anti-reflective coating has a light transmission of 96% or higher, it is transparent to light sources; 2) the top anti-reflective coating has a refractive index between 1.5 and 1.65; 3) the top anti-reflective coating composition does not dissolve the underlying photosensitizer; 4) the top anti-reflective coating is not soluble in water upon light exposure; 5) the top anti-reflective coating is highly soluble in a developing solution; and 6) the top anti-reflective coating enables the formation of a vertical pattern.

Particularly, since the top anti-reflective coating composition of the present invention dissolves a portion of a photoacid generator present at the top of an underlying photosensitizer upon formation of a top anti-reflective coating, it can prevent the top from being formed into a thick section.

Accordingly, the top anti-reflective coating formed using the anti-reflective coating composition of the present inven- tion can be applied to immersion lithography, and can decrease the reflection at the top of the photoresist, thereby minimizing the alteration of CD.

In conclusion, since the top anti-reflective coating composition of the present invention enables the formation of a fine photoresist pattern, it contributes to the fabrication of sub-50 nm semiconductor devices in an efficient manner.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A top anti-reflective coating composition, comprising:
a top anti-reflective coating polymer selected from the group consisting of:
poly(t-butylacrylate-acrylic acid-3-hydroxypropyl-methacrylate) of Formula 5 below:

Formula (5)

poly(t-butylacrylate-acrylic acid-N-isopropylacrylamide) of Formula 6 below:

Formula (6)

poly(t-butylacrylate-acrylic acid-2-hydroxyethyl-methacrylate) of Formula 7 below:

Formula (7)

wherein a, b and c, representing the mole fraction of each monomer, are in the range between 0.05 and 0.9;

a bissulfone compound, as a photoacid generator, represented by Formula 1 below:

(1)

wherein $R_1$ and $R_2$ are independently a straight, branched or cyclic alkyl, aryl, alkenyl, oxoalkyl or oxoaryl group of 1 to 20 carbon atoms; or a halogen-substituted straight, branched or cyclic alkyl, aryl, alkenyl, oxoalkyl or oxoaryl group of 1 to 20 carbon atoms; and an organic solvent.

2. The composition according to claim 1, wherein the bissulfone compound of Formula 1 is bistrifluoromethyl sulfonyl methane represented by Formula 2 below:

(2)

bisethyl sulfonyl methane represented by Formula 3 below:

(3)

bis-p-toluene sulfonyl methane represented by Formula 4 below:

(4)

3. The composition according to claim 1, wherein the composition comprises 0.05~5 wt % of the bissulfone compound, based on the weight of the top anti-reflective coating polymer.

4. The composition according to claim 1, wherein the organic solvent is n-butanol.

5. The composition according to claim 4, wherein the composition is prepared by dissolving the top anti-reflective coating polymer in 1,000~10,000 wt % of n-butanol, based on the weight of the polymer.

6. The composition according to claim 1, further comprising an acid diffusion inhibitor.

7. The composition according to claim 6, wherein the acid diffusion inhibitor is L-proline.

8. The composition according to claim 7, wherein the composition comprises 1~20 wt % of the L-proline, based on the weight of the top anti-reflective coating polymer.

9. The composition according to claim 1, wherein the composition has a refractive index between 1.5 and 1.65.

10. A method for forming a pattern of a semiconductor device, comprising:
(a) applying a photoresist to a semiconductor substrate on which a particular underlying structure is formed;
(b) applying the top anti-reflective coating composition according to claim 1 on top of the photoresist to form a top anti-reflective coating; and
(c) exposing the photoresist to light, followed by developing, to form a photoresist pattern.

11. The method according to claim 10, further comprising carrying out baking before and/or after light exposure.

12. The method according to claim 11, comprising carrying out baking at 70° C.~200° C.

13. The method according to claim 10, comprising transmitting light through a water medium during light exposure.

14. The method according to claim 10, comprising developing the photoresist by contacting the photoresist with developing solution comprising a 0.01~5% (w/w) solution of tetramethylammoniumhydroxide (TMAH) in water.

* * * * *